(12) United States Patent
Anderson

(10) Patent No.: US 9,031,523 B2
(45) Date of Patent: May 12, 2015

(54) SYSTEMS AND METHODS FOR DETERMINING ANTENNA IMPEDANCE

(75) Inventor: William David Anderson, Chapel Hill, NC (US)

(73) Assignee: HTC Corporation, Taoyuan, Taoyuan County (TW)

( * ) Notice: Subject to any disclaimer, the term of this patent is extended or adjusted under 35 U.S.C. 154(b) by 505 days.

(21) Appl. No.: 13/533,448

(22) Filed: Jun. 26, 2012

(65) Prior Publication Data

US 2013/0342404 A1 Dec. 26, 2013

(51) Int. Cl.
*H04B 1/18* (2006.01)
*H04B 1/02* (2006.01)
*H04B 1/40* (2006.01)
*G01R 29/10* (2006.01)

(52) U.S. Cl.
CPC ...................... *G01R 29/10* (2013.01)

(58) Field of Classification Search
CPC ........ G01R 29/10; G01R 27/06; G01R 27/04; H03H 7/40; H03H 11/20; H03H 11/22; H04B 1/0458
USPC .......... 455/193.1, 107, 77, 87, 120–121, 125, 455/160.1, 178.1, 188.1, 189.1, 191.1, 455/193.2–197.3, 115.1, 115.4; 324/646; 327/58
See application file for complete search history.

(56) References Cited

U.S. PATENT DOCUMENTS

| | | | | |
|---|---|---|---|---|
| 4,015,223 A * | 3/1977 | Cheze | ........................... | 333/17.3 |
| 4,493,112 A * | 1/1985 | Bruene | ........................... | 455/123 |
| 4,621,242 A * | 11/1986 | Theall et al. | .................. | 333/17.3 |
| 5,225,847 A | 7/1993 | Roberts et al. | | |
| 5,420,552 A * | 5/1995 | Sakka | ........................... | 333/17.1 |
| 5,564,086 A * | 10/1996 | Cygan et al. | ................... | 455/126 |
| 5,629,653 A | 5/1997 | Stimson | | |
| 5,757,247 A * | 5/1998 | Koukkari et al. | ............. | 333/17.1 |
| 5,778,308 A * | 7/1998 | Sroka et al. | ................ | 455/115.1 |
| 6,051,996 A * | 4/2000 | Myer | ................................ | 327/3 |
| 6,178,310 B1 * | 1/2001 | Jeong, II | ..................... | 455/67.11 |
| 6,529,088 B2 | 3/2003 | Lafleur et al. | | |

(Continued)

FOREIGN PATENT DOCUMENTS

CN 101587156 A 11/2009
TW 201132992 10/2011

OTHER PUBLICATIONS

English translation of abstract of TW 201132992 (published Oct. 1, 2011).

(Continued)

*Primary Examiner* — Pablo Tran
(74) *Attorney, Agent, or Firm* — McClure, Qualey & Rodack, LLP

(57) ABSTRACT

A method for measuring an impedance of an antenna includes generating, by a signal source coupled to the antenna, a radio frequency (RF) signal, applying the RF signal to a directional coupler, and mixing, by a first mixer, a first signal from the directional coupler with a signal, wherein the first signal corresponds to a reflected power from the antenna. The method further includes mixing, by a second mixer, a second signal with the signal, wherein the second signal is offset from the first signal by ninety degrees. The method further includes outputting, by a first lower pass filter (LPF) coupled to an output of the first mixer, a real part of a reflection coefficient of the antenna and outputting, by a second lower pass filter (LPF) coupled to an output of the second mixer, an imaginary part of the reflection coefficient.

18 Claims, 7 Drawing Sheets

(56) References Cited

U.S. PATENT DOCUMENTS

| | | |
|---|---|---|
| 7,339,656 B2 | 3/2008 | Matsumoto et al. |
| 7,761,065 B2 | 7/2010 | Drogi et al. |
| 7,821,273 B2 * | 10/2010 | Van Bezooijen et al. ..... 324/646 |
| 8,095,085 B2 | 1/2012 | Song et al. |
| 2007/0197180 A1 * | 8/2007 | McKinzie et al. ......... 455/248.1 |
| 2010/0327927 A1 | 12/2010 | Nagarkatti et al. |
| 2012/0217980 A1 | 8/2012 | Pausini |

OTHER PUBLICATIONS

English translation of abstract of CN 101587156 (published Nov. 25, 2009).

Taiwan Office Action dated Aug. 4, 2013.

* cited by examiner

SYSTEMS AND METHODS FOR DETERMINING ANTENNA IMPEDANCE

BACKGROUND

With the rapid development in communications technology, mobile devices have become an integral part of many people's lives given the portability and the growing number of applications available on mobile devices. Today, individuals can perform a wide range of functions such as e-mail communications, web surfing, electronic commerce, etc. via mobile devices. Holding a mobile device can result in antenna loading, thereby affecting the antenna performance of the mobile device. Antenna loading can also occur when objects are placed in close proximity to the mobile device. When objects come in close proximity to an antenna, various issues may arise. For example, radio frequency (RF) power can be absorbed or blocked by the object and furthermore, the antenna impedance can change. Both of these issues cause a decrease in the radiated output power and the radiated sensitivity.

SUMMARY

Briefly described, one embodiment, among others, is an apparatus for measuring an impedance of an antenna. The apparatus comprises a signal source coupled to the antenna, the signal source configured to generate a radio frequency (RF) signal. the apparatus further comprises a directional coupler configured to receive the RF signal and output a reflected signal and a forward power signal from the RF signal, a first mixer coupled to the directional coupler, the first mixer configured to mix the reflected signal with a signal to generate a first sum product.

The apparatus further comprises a first low pass filter (LPF) coupled to an output of the first mixer, the first LPF configured to generate a first output corresponding to a reflection coefficient of the antenna and a delay element coupled to the output of the directional coupler, the delay element configured to generate a delayed version of the reflected signal. The apparatus further comprises a second mixer coupled to the delay element, the second mixer configured to mix the delayed version of the reflected signal with the signal to generate a second sum product and a second low pass filter (LPF) coupled to an output of the second mixer, the second LPF configured to generate a second output corresponding to the reflection coefficient. The first output corresponds to a real part of the reflection coefficient, and wherein the second output corresponds to an imaginary part of the reflection coefficient.

Another embodiment is a method for measuring an impedance of an antenna. The method comprises generating, by a signal source coupled to the antenna, a radio frequency (RF) signal, applying the RF signal to a directional coupler, and mixing, by a first mixer, a first signal from the directional coupler with a signal, wherein the first signal corresponds to a reflected power from the antenna. The method further comprises mixing, by a second mixer, a second signal with the signal, wherein the second signal is offset from the first signal by ninety degrees. The method further comprises outputting, by a first lower pass filter (LPF) coupled to an output of the first mixer, a real part of a reflection coefficient of the antenna and outputting, by a second lower pass filter (LPF) coupled to an output of the second mixer, an imaginary part of the reflection coefficient.

Another embodiment is an apparatus for measuring an impedance of an antenna. The apparatus comprises a signal source configured to apply a radio frequency (RF) test signal to the antenna and a directional coupler coupled to the signal source, the directional coupler configured to output a reflected signal and a forward power signal of the RF signal. The apparatus further comprises a quadrature downconverter configured to generate a first sum product and a first low pass filter (LPF) configured to filter the first sum product to generate a first output corresponding to a reflection coefficient of the antenna.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

In small mobile devices, the antenna design is optimized to maximize radiated performance across several different bands. The resultant frequency response tends to be reasonably flat within desired bands and then falls off steeply at the band edges. In general, simply holding a mobile device can "detune" the antenna of the mobile device, where the frequency response of the antenna is effectively shifted. In some cases, this detuning can push the response into the steep fall-off portion and result in many decibels (dB) of detuning of the antenna. As such, the radiated power may be decreased, received sensitivity may be decreased, and overall radio frequency (RF) quality may be reduced.

Placing an object in close proximity to the antenna of the mobile device can similarly result in antenna loading, thereby affecting the antenna performance of the mobile device. Radio frequency (RF) power can be absorbed or blocked by the object and the antenna impedance is affected. Both of these issues cause a decrease in the radiated output power and the radiated sensitivity.

Traditionally, fixed matching networks are placed between the antenna and the radio transceiver. However, while the antenna may be well-matched under one condition, the antenna may be poorly matched under other conditions. As an alternative, a variable matching network that contains one or more adjustable components may be implemented. The most common adjustable components are variable capacitors that are typically configured by varying a control voltage or a register setting. The variable capacitors may be combined with fixed value components in a wide variety of ways to form a tuner. A tuner may then provide a match over a range of impedances instead of just one.

In open loop antenna tuning systems, the tuner is adjusted according to the current condition. For example, the tuner may be adjusted one way when operating in band 5 and a different way when operating in band 2. Many mobile devices today have proximity sensors that can detect when the phone is near an object. As such, the tuner may provide antenna matching for improved performance. However, with open loop tuning systems, the mobile device has no direct knowledge of the antenna impedance. The antenna impedance can change substantially by simply placing a finger on the antenna. Significantly, with open loop tuning systems, the mobile device is generally unaware of the change in antenna impedance and therefore, the tuner may not be optimized for performance. Disclosed are various embodiments for providing a closed loop antenna tuning system whereby changes in the antenna impedance are detected so that antenna tuning may be performed to optimize performance. In the following discussion, a general description of a system and its components for performing data throttling is provided, followed by a discussion of the operation of the same.

Figure 1:
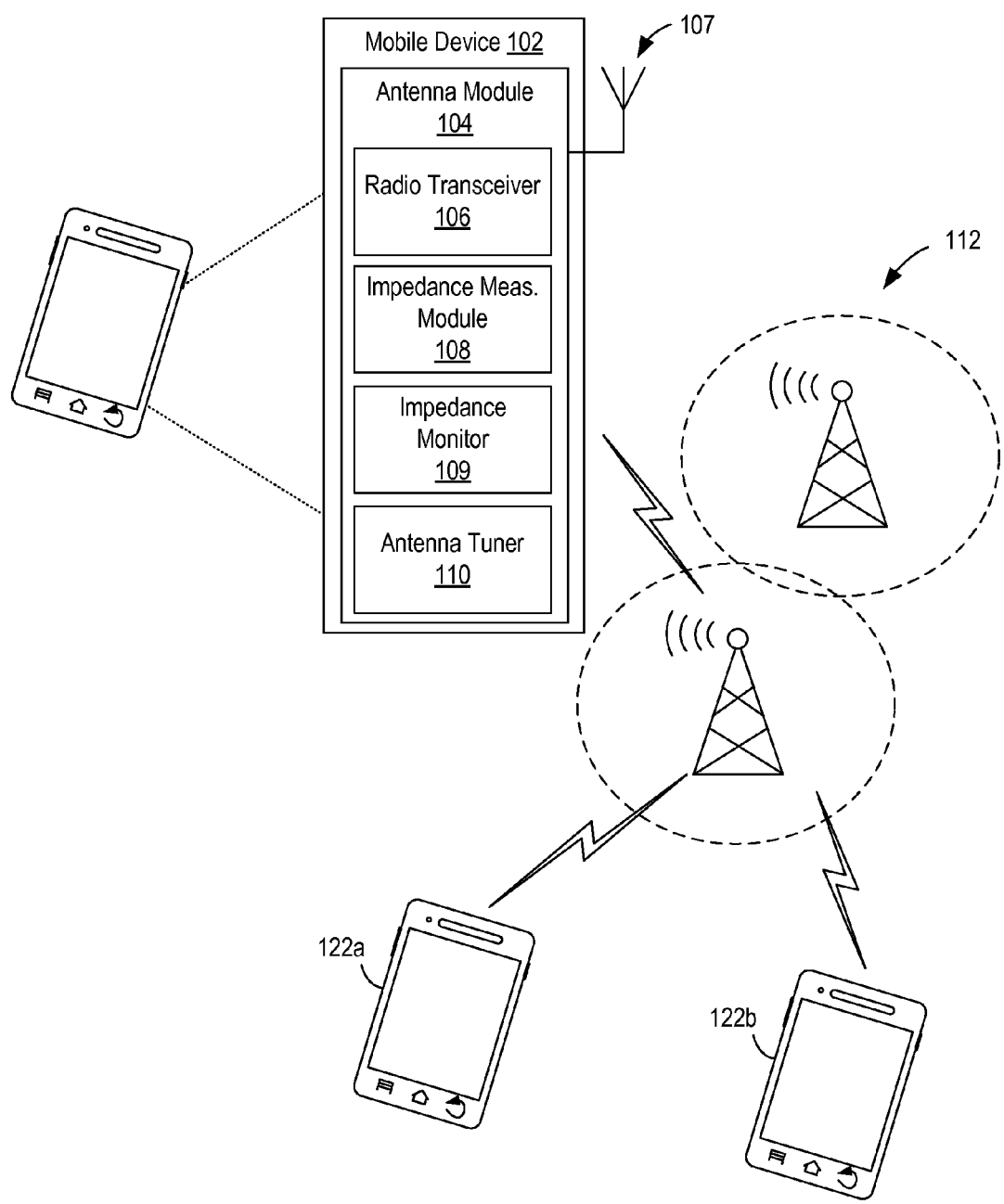
FIG. 1 is a block diagram of a system in which embodiments for facilitating the measurement of impedance data may be implemented in accordance with various embodiments.

FIG. 1 is a block diagram of a system in which embodiments for facilitating the measurement of impedance data may be implemented in accordance with various embodiments. Shown is a mobile device 102, which may be embodied, for example, as a smartphone, tablet, or other computing devices with integrated communications capabilities. The mobile device 102 may communicate with other mobile devices 122a, 122b via one or more cellular towers 112, which provide cellular service across various cell coverage areas. The cellular service may include second, third, fourth generation telecommunication systems such as Global System for Mobile communications (GSM) system, Universal Mobile Telecommunications System (UMTS), and Long Term Evolution (LTE) system, and so on.

Applications, logic, and/or other functionality may be executed in the mobile device 102 according to various embodiments. The components executed on the mobile device 102 include, for example, an antenna module 104 coupled to the antenna 107. The antenna module 104 includes a radio transceiver 106 for transmitting and receiving wireless signals. The radio transceiver 106 may be connected to the Public Switched Telephone Network (PSTN) and the Internet for accessing voice and data services, respectively.

The antenna module 104 of the mobile device 102 further includes an impedance measurement module 108 configured to measure the impedance of the antenna 107 using the transmitter portion of the radio transceiver 106. The impedance monitor 109 receives measurements from the impedance measurement module 108 and derives the antenna impedance. In accordance with various embodiments, the impedance monitor 109 determines whether the antenna impedance or resonant frequency has changed, where the antenna impedance is derived from the reflection coefficient. Based on changes in the antenna impedance, the impedance monitor 109 forwards the information to the antenna tuner 110. The antenna tuner 110 is configured to compensate for any changes to the antenna impedance.

Figure 2:
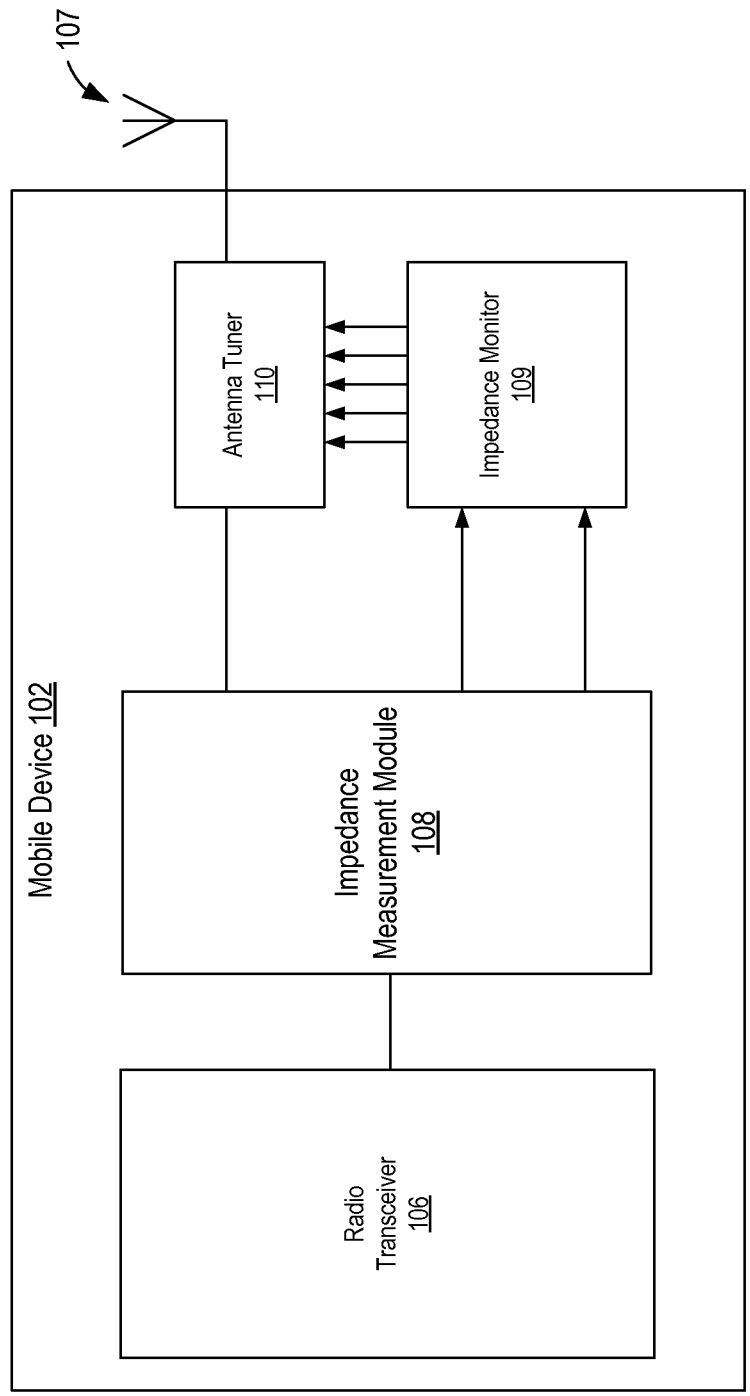
FIG. 2 illustrates the signal flow between the various components of the mobile device in FIG. 1 for facilitating the measurement of impedance data according to an embodiment of the present disclosure.

With reference to FIG. 2, shown is the signal flow between the various components of the mobile device 102 in FIG. 1 according to an embodiment of the present disclosure. The mobile device 102 is configured to utilize the transmitter of the radio transceiver 106 to measure the impedance of the antenna 107. In particular, through the use of a directional coupler in conjunction with the transmitter, the impedance measurement module 108 extracts the reflection coefficient of the antenna 107 and forwards this information to the impedance monitor 109. Based on this information, the impedance monitor 109 determines the antenna impedance 202. In particular, the impedance monitor 109 monitors the antenna impedance measurements to determine whether any changes in the antenna impedance have occurred. Based on a change in the antenna impedance, the impedance monitor 109 forwards the antenna impedance to the antenna tuner 110. Based on these impedance measurements, the antenna tuner 110 compensates for any changes in the impedance to optimize the performance of the antenna 107.

Figure 3:
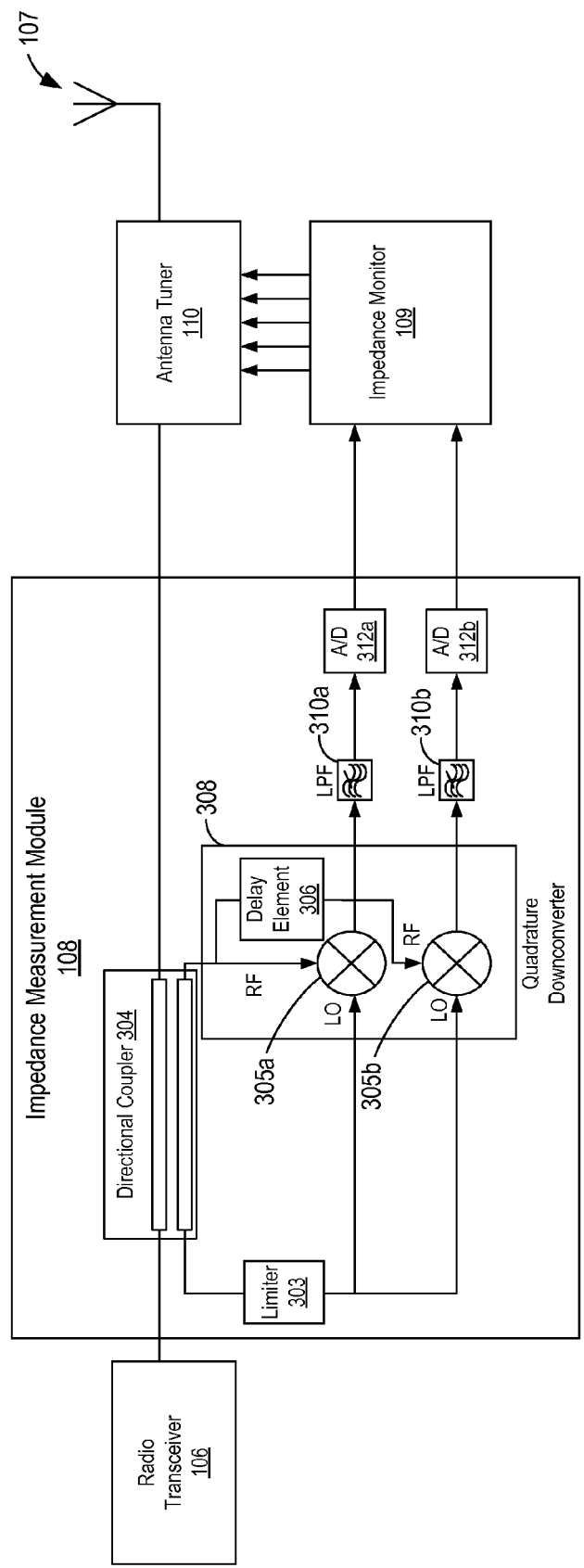
FIG. 3 illustrates one implementation of the impedance measurement module of the mobile device in FIG. 1 for facilitating the measurement of impedance data according to an embodiment of the present disclosure.

With reference to FIG. 3, shown is one possible implementation of the impedance measurement module 108 of the mobile device 102 in FIG. 1 for facilitating the measurement of impedance data according to an embodiment of the present disclosure. The radio transceiver 106 generates an RF signal, which is applied to a directional coupler 304 in the impedance measurement module 108.

Figure 4:
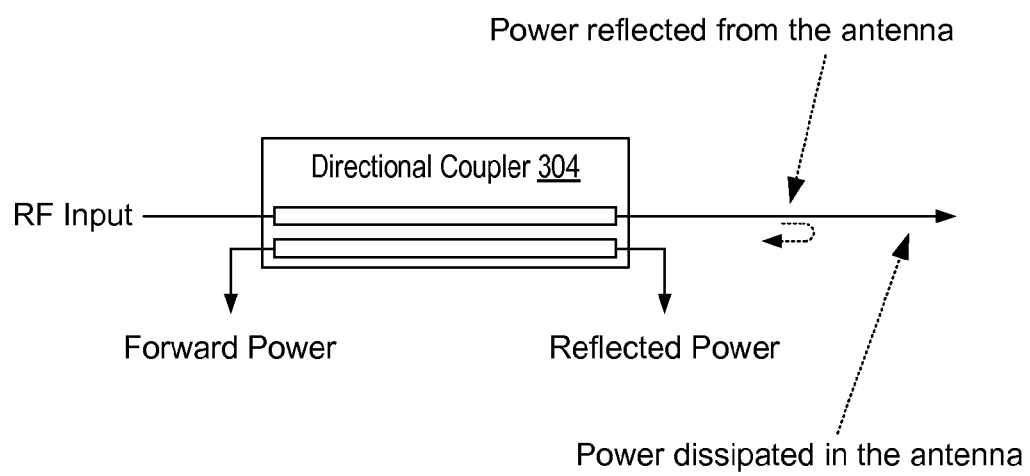
FIG. 4 illustrates operation of the directional coupler in the impedance measurement module in FIG. 3.

Reference is made briefly to FIG. 4, which illustrates operation of the directional coupler 304. As shown, there are two outputs from the directional coupler 304, where the directional coupler 304 is coupled to the radio transceiver 106 (FIG. 3). Due to an impedance mismatch, a portion of the RF input generated by the radio transceiver 106 is reflected back from the antenna 107 (FIG. 3). The first signal is proportional to the forward power of the RF signal generated by the radio transceiver 106, while the second signal is proportional to the power reflected from the antenna 107.

Where the antenna load impedance is a perfect match, the reflected power is equal to zero. However, the first signal output from the directional coupler 304 is always proportional to the forward power regardless of the load impedance. Note also that the phase difference between the forward power and the reflected power is proportional to the angle of the reflection coefficient of the load (i.e., the antenna). Various embodiments leverage this concept to extract information relating to the antenna impedance.

Referring back to FIG. 3, the impedance measurement module 108 further comprises a quadrature downconverter 308, which includes mixers 305a, 305b for mixing the reflected power signal (the output on the right of the directional coupler 304) with a signal derived from the transmit signal to generate a first and second sum product. The impedance measurement module 108 also includes a limiter 303 coupled to the output on the left of the directional coupler 304 (the forward power signal). The limiter 303 limits the magnitude of the forward power signal to a predetermined level, essentially removing the magnitude information of the forward power signal such that only phase information is output by the limiter 303. The limiter 303 outputs the signal fed into the mixers 305a, 305b of the quadrature downconverter 308.

The impedance measurement module 108 includes low pass filters (LPF) 310a, 310b coupled to the output of the mixers 305a, 305b to filter out high frequency components of the outputs of the mixers. Specifically, the low pass filters 310a, 310b are configured to filter out such frequency components as the transmit frequency of the radio transceiver 106. This allows relatively low frequency components to pass through. The LPF 310a, 310b allow the lower frequency components to be measured so that such useful information as the reflection coefficient associated with the impedance of the antenna 107 changes may be determined. Based on the reflection coefficient, the antenna impedance may then be derived.

The delay element 306 in the impedance measurement module 108 introduces a phase offset (e.g., ninety degrees) into the reflected power signal and allows the mixers 305a, 305b to generate the real and imaginary components of the impedance information. Specifically, the first mixer 305a outputs the real component, while the second mixer 305b outputs the imaginary component. In accordance with various embodiments, the signals mentioned above are scaled with amplitude and phase offsets that are specific to the implementation. For example, phase offsets can arise from trace lengths and amplitude offsets can arise from the directional coupler coupling factor. Since these offsets are constant, they can be calibrated out so that the true complex antenna impedance can be determined. The real and imaginary components of the antenna impedance are then forwarded to the impedance monitor 109, which forwards any changes in the antenna impedance to the antenna tuner 110.

Figure 5:
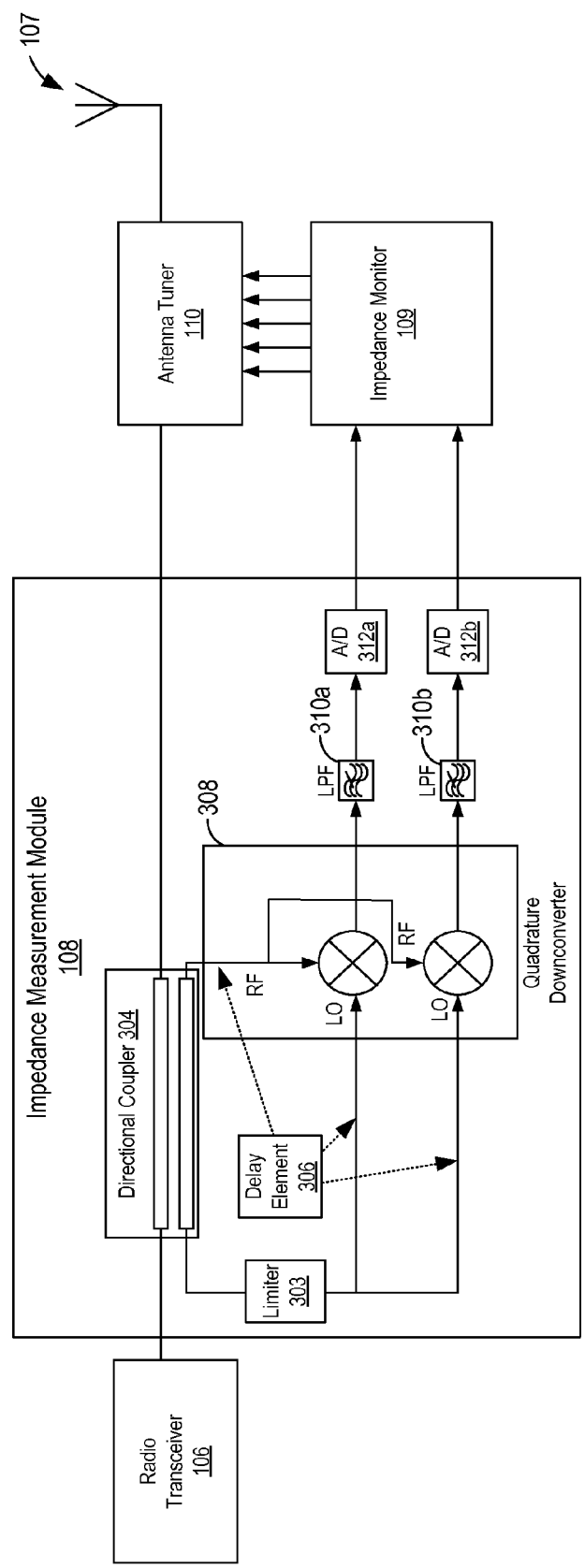
FIG. 5 illustrates an alternative implementation of the impedance measurement module of the mobile device in FIG. 1 for facilitating the measurement of impedance data according to an embodiment of the present disclosure

Reference is made to FIG. 5, which illustrates an alternative implementation of the impedance measurement module 108 of the mobile device 102 in FIG. 1 for facilitating the measurement of impedance data according to an embodiment of the present disclosure. In the implementation of the impedance measurement module 108 shown in FIG. 3, the delay element 306 is implemented at the second output of the directional coupler 304 corresponding to the reflected power. However, the delay element 306 can be placed in other branches of the circuit as illustrated in FIG. 5 to achieve the same effect where the real and imaginary components of the impedance information are determined.

Figure 6:
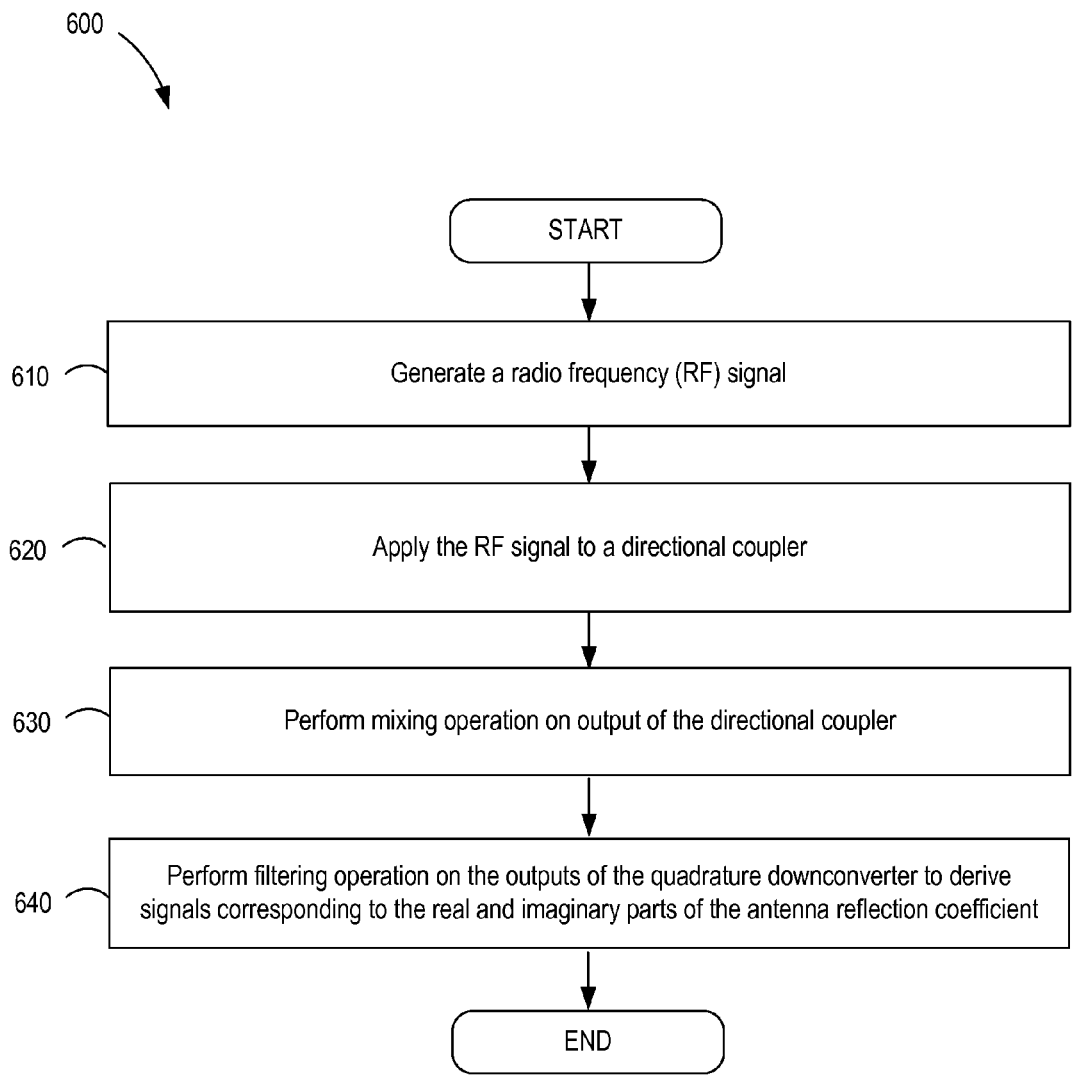
FIG. 6 is a top-level flowchart illustrating examples of functionality implemented as portions of the mobile device of FIG. 1 for facilitating the measurement of antenna impedance according to various embodiments of the present disclosure.

Reference is made to FIG. 6, which is a flowchart 600 in accordance with one embodiment for facilitating the measurement of antenna impedance performed by the mobile device 102 (FIG. 1). It is understood that the flowchart 600 of FIG. 6 provides merely an example of the many different types of functional arrangements that may be employed. As an alternative, the flowchart of FIG. 6 may be viewed as depicting an example of steps of a method implemented in the mobile device 102 according to one or more embodiments.

In block 610, the radio transceiver 106 (FIG. 1) of the mobile device 102 generates an RF signal, which will be utilized for characterizing the impedance of the antenna 107 (FIG. 1).

In block 620, the RF signal generated by the radio transceiver 106 is applied to the directional coupler 304 (FIG. 3), which outputs both the forward power signal and the reflected power signal corresponding to the RF signal transmitted via the antenna 107. As discussed earlier, there are two outputs from the directional coupler 304 coupled to the radio transceiver 106. Due to an impedance mismatch, a portion of the RF input is reflected back from the antenna 107 (FIG. 1). The first signal is proportional to the forward power of the RF signal generated by the radio transceiver 106, while the second signal is proportional to the power reflected from the antenna 107.

As such, where the antenna load impedance is a perfect match, the reflected power is equal to zero. However, the first signal output from the directional coupler 304 is always proportional to the forward power regardless of the load impedance. Note also that the phase difference between the forward power and the reflected power is proportional to the angle of the reflection coefficient of the load (i.e., the antenna).

In block 630 a mixing operation is performed on the reflected power signal derived by the directional coupler 304. In particular, mixers 305a, 305b (FIG. 3) in the quadrature downconverter 308 (FIG. 3) mixes the reflected power signal (the output on the right of the directional coupler 304) with a signal derived from the generated RF signal to generate a first and second sum product.

The limiter 303 (FIG. 3) limits the magnitude of the forward power signal output by the directional coupler 304 to a predetermined level, essentially removing the magnitude information of the forward power signal such that only phase information is output by the limiter 303. The output of the limiter 303 is then fed into the mixers 305a, 305b of the quadrature downconverter 308.

In block 640, a filtering operation is performed on the outputs of the quadrature downconverter 308 to derive signals corresponding to the antenna reflection coefficient, where the filtering operation is performed by the LPF 310a, 310b (FIG. 3) to filter out higher frequency components (e.g., the transmit frequency of the radio transceiver 106) while allowing lower frequency components to pass through. The outputs of the LPF 310a, 310b correspond to the real and imaginary components of the reflection coefficient.

In accordance with various embodiments, amplitude and phase components are then calibrated out from both the real and imaginary parts of the impedance information (i.e., reflection coefficient) corresponding to the antenna impedance as these parameters are constants. These constant values correspond to amplitude and phase components of the RF signal applied to the directional coupler 304. This is performed in order to derive the magnitude of the antenna impedance and the rate of change of the antenna impedance.

Figure 7:
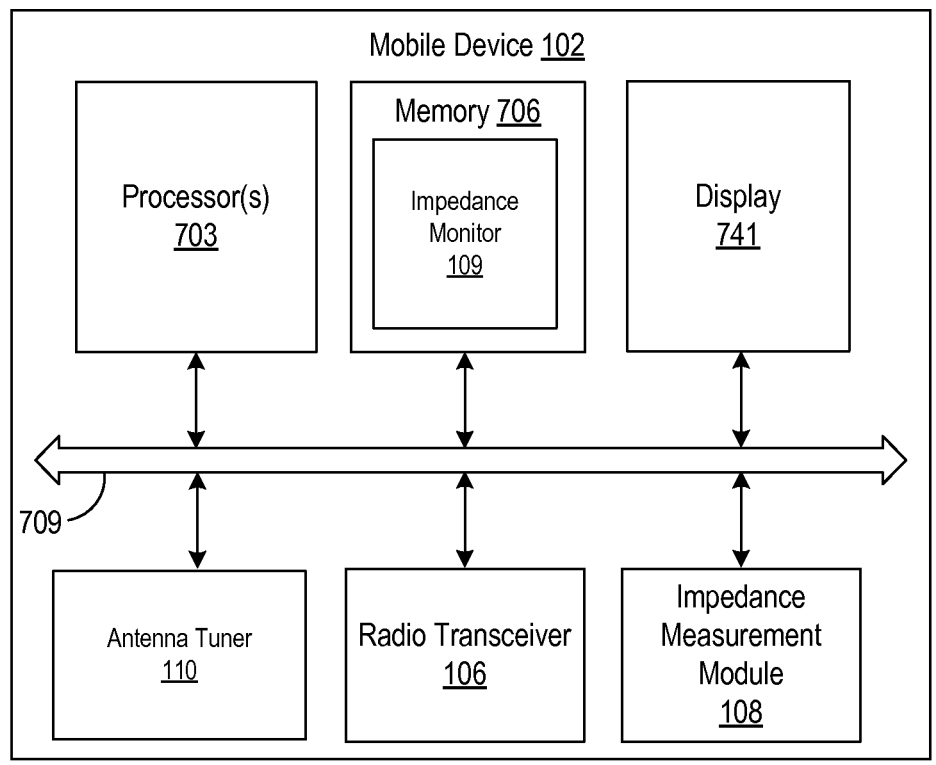
FIG. 7 is a schematic block diagram of the mobile device in FIG. 1 according to an embodiment of the present disclosure.

With reference to FIG. 7, shown is a schematic block diagram of the mobile device 102 in which methods for measuring antenna impedance is implemented according to an embodiment of the present disclosure. The mobile device 102 includes at least one processor 703 and a memory 706, which are coupled to a local interface 709. The local interface 709 may comprise, for example, a data bus with an accompanying address/control bus or other bus structure as can be appreciated.

Stored in the memory 706 are both data and several components that are executable by the processor 703. In particular, stored in the memory 706 and executable by the processor 703 is the impedance monitor 109 and potentially other applications. In addition, an operating system may be stored in the memory 706 and executable by the processor 703. The mobile device 102 also includes a display 741 such as a touchscreen display, a radio transceiver 106, an antenna tuner 110, and an impedance measurement module 108.

The radio transceiver 106 comprises various components used to transmit and/or receive data wirelessly. By way of example, the radio transceiver 106 may communicate with both inputs and outputs, for instance, a radio modem interface, wireless (e.g., radio frequency (RF), IEEE 802.11 based communications) transceiver, and so on.

It is understood that there may be other applications that are stored in memory 706 and are executable by the processor 703 as can be appreciated. Where any component discussed herein is implemented in the form of software, any one of a number of programming languages may be employed. A number of software components are stored in memory 706 and are executable by the processor 703. In this respect, the term executable means a program file that is in a form that can ultimately be run by the processor 703.

Examples of executable programs may be, for example, a compiled program that can be translated into machine code in a format that can be loaded into a random access portion of memory 706 and run by the processor 703, source code that may be expressed in proper format such as object code that is capable of being loaded into a random access portion of memory 706 and executed by the processor 703, or source code that may be interpreted by another executable program to generate instructions in a random access portion of memory 706 to be executed by the processor 703, etc. An executable program may be stored in any portion or component of memory 706 including, for example, random access memory (RAM), read-only memory (ROM), hard drive, solid-state drive, USB flash drive, memory card, or other memory components.

The memory 706 is defined herein as including both volatile and nonvolatile memory and data storage components. Volatile components are those that do not retain data values upon loss of power. Nonvolatile components are those that retain data upon a loss of power. Thus, memory 706 may comprise, for example, random access memory (RAM), read-only memory (ROM), hard disk drives, solid-state drives, USB flash drives, memory cards accessed via a memory card reader, and/or other memory components, or a combination of any two or more of these memory components.

In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

The processor 703 may represent multiple processors and memory 706 may represent multiple memories that operate in parallel processing circuits, respectively. In such a case, the local interface 709 may be an appropriate network that facilitates communication between any two of the multiple processors, between any processor and any of the multiple memories, or between any two memories, etc. Such a local interface 709 may comprise additional systems designed to coordinate this communication, including, for example, performing load balancing. The processor 703 may be of electrical or of some other available construction.

Although the components and applications described herein may be embodied in software or code executed by general purpose hardware as discussed above, as an alternative the same may also be embodied in dedicated hardware or a combination of software/general purpose hardware and dedicated hardware.

If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The flowchart 600 of FIG. 6 shows an example of functionality associated with implementation of the various components in the mobile device 102. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system or other system. The machine code may be converted from the source code, etc. If embodied in hardware, each block may represent a circuit or a number of interconnected circuits to implement the specified logical function(s).

Although the flowchart 600 of FIG. 6 shows a specific order of execution, it is understood that the order of execution may differ from that which is depicted. For example, the order of execution of two or more blocks may be scrambled relative to the order shown. Also, two or more blocks shown in succession in FIG. 6 may be executed concurrently or with partial concurrence. Furthermore, in some embodiments, one or more of the blocks shown in FIG. 6 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code can be embodied in any non-transitory computer-readable medium for use by or in connection with an instruction execution system such as, for example, a processor in a computer system or other system. Each may comprise, for example, statements including instructions and declarations that can be fetched from the computer-readable medium and executed by the instruction execution system.

In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs.

Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

At least the following is claimed:

1. An apparatus for measuring an impedance of an antenna, comprising:
   a signal source coupled to the antenna, the signal source configured to generate a radio frequency (RF) signal;
   a directional coupler configured to receive the RF signal and output a reflected signal and a forward power signal from the RF signal;
   a limiter coupled to the directional coupler to remove magnitude information from the forward power signal;
   a first mixer coupled to the directional coupler, the first mixer configured to mix the reflected signal with a signal, derived from the forward power signal via the limiter such that the signal contains only phase information associated with the forward power signal, to generate a first sum product; and
   a first low pass filter (LPF) coupled to an output of the first mixer, the first LPF configured to generate a first output corresponding to a reflection coefficient of the antenna;
   a delay element coupled to the output of the directional coupler, the delay element configured to generate a delayed version of the reflected signal; and
   a second mixer coupled to the delay element, the second mixer configured to mix the delayed version of the reflected signal with the signal to generate a second sum product;
   a second low pass filter (LPF) coupled to an output of the second mixer, the second LPF configured to generate a second output corresponding to the reflection coefficient,
   wherein the first output corresponds to a real part of the reflection coefficient, and wherein the second output corresponds to an imaginary part of the reflection coefficient.

2. The apparatus of claim 1, further comprising a limiter coupled to the directional coupler and the first mixer, the limiter configured to generate the signal from the forward power signal.

3. The apparatus of claim 2, wherein the limiter generates the signal from the forward power signal by attenuating an amplitude of the forward power signal to a predetermined level.

4. The apparatus of claim 2, wherein a frequency of the signal is equal to a frequency of the RF signal.

5. The apparatus of claim 4, wherein a cutoff frequency of the first LPF is less than the frequency of the RF signal.

6. The apparatus of claim 1, wherein the first mixer and the second mixer comprise quadrature mixers.

7. The apparatus of claim 1, wherein the delayed version of the reflected signal comprises the reflected signal with a phase offset of ninety degrees.

8. A method for measuring an impedance of an antenna, comprising:
   generating, by a signal source coupled to the antenna, a radio frequency (RF) signal;
   applying the RF signal to a directional coupler to generate a forward power signal and a reflected signal;
   removing magnitude information from the forward power signal to generate a signal such that the signal contains only phase information associated with the forward power signal;
   mixing, by a first mixer, the reflected signal from the directional coupler with the signal, wherein the reflected signal corresponds to reflected power from the antenna;
   mixing, by a second mixer, a second signal with the signal, wherein the second signal is phase offset from the reflected signal;
   outputting, by a first lower pass filter (LPF) coupled to an output of the first mixer, a real part of a reflection coefficient of the antenna; and
   outputting, by a second lower pass filter (LPF) coupled to an output of the second mixer, an imaginary part of the reflection coefficient of the antenna.

9. The method of claim 8, wherein the frequency of the signal is equal to a frequency of the RF signal.

10. The method of claim 9, wherein cutoff frequencies for the first LPF and the second LPF are less than a frequency of the RF signal.

11. The method of claim 8, further comprising calibrating out constant values from both the real and imaginary parts of the magnitude of the antenna impedance and the rate of change of the antenna impedance.

12. The method of claim 11, wherein the constant values correspond to amplitude and phase components of the RF signal applied to the directional coupler.

13. An apparatus for measuring an impedance of an antenna, comprising:
   a signal source configured to apply a radio frequency (RF) test signal to the antenna;
   a directional coupler coupled between the signal source and the antenna, the directional coupler configured to output a reflected signal and a forward power signal of the RF signal;
   a limiter coupled to the directional coupler to remove magnitude information from the forward power signal such that the signal contains only phase information associated with the forward power signal;
   a quadrature downconverter configured to generate a first sum product; and
   a first low pass filter (LPF) configured to filter the first sum product to generate a first output corresponding to a reflection coefficient of the antenna;
   wherein the quadrature downconverter comprises:
   a first mixer configured to mix the reflected signal with the signal to generate the first sum product; and
   a second mixer configured to mix a delayed version of the reflected signal with the signal to generate a second sum product.

14. The apparatus of claim 13, further comprising a second low pass filter (LPF) configured to filter the second sum product to generate a second output corresponding to the reflection coefficient.

15. The apparatus of claim 14, wherein cutoff frequencies of the first LPF and the second LPF are less than the frequency of the RF signal.

16. The apparatus of claim 14, wherein the delayed version of the reflected signal is shifted by ninety degrees.

17. The apparatus of claim 14, wherein the first output corresponds to a real part of the reflection coefficient.

18. The apparatus of claim 17, wherein the second output corresponds to an imaginary part of the reflection coefficient.

* * * * *